US012422580B2

United States Patent
Cai et al.

(10) Patent No.: US 12,422,580 B2
(45) Date of Patent: Sep. 23, 2025

(54) PHYSICS-BASED AND DATA-DRIVEN INTEGRATED METHOD FOR ROCK BURST HAZARD ASSESSMENT

(71) Applicant: CHINA UNIVERSITY OF MINING AND TECHNOLOGY, Xuzhou (CN)

(72) Inventors: Wu Cai, Xuzhou (CN); Qiang Lu, Xuzhou (CN); Siyuan Gong, Xuzhou (CN); Anye Cao, Xuzhou (CN); Xuming Zhu, Xuzhou (CN); Xiang Ma, Xuzhou (CN); Linming Dou, Xuzhou (CN)

(73) Assignee: CHINA UNIVERSITY OF MINING AND TECHNOLOGY, Xuzhou (CN)

( * ) Notice: Subject to any disclaimer, the term of this patent is extended or adjusted under 35 U.S.C. 154(b) by 376 days.

(21) Appl. No.: 17/903,683

(22) Filed: Sep. 6, 2022

(65) Prior Publication Data
US 2023/0152479 A1  May 18, 2023

(30) Foreign Application Priority Data
Nov. 12, 2021  (CN) .......................... 202111337335.9

(51) Int. Cl.
*G01V 1/30* (2006.01)
*G01V 1/28* (2006.01)
*G06F 30/20* (2020.01)

(52) U.S. Cl.
CPC ................ *G01V 1/30* (2013.01); *G01V 1/282* (2013.01); *G01V 2210/60* (2013.01); *G06F 30/20* (2020.01)

(58) Field of Classification Search
CPC .......... G01V 1/28; G01V 1/282; G01V 1/288; G01V 1/30; G01V 2210/60; G06F 30/20
See application file for complete search history.

(56) References Cited

FOREIGN PATENT DOCUMENTS

| CN | 109736886 A | * | 5/2019 |
| CN | 114778800 A | * | 7/2022 |

* cited by examiner

Primary Examiner — Manuel L Barbee
(74) Attorney, Agent, or Firm — HUNTON ANDREWS KURTH LLP

(57) ABSTRACT

The present disclosure provides a physics-based and data-driven integrated method for rock burst hazard assessment, including the following steps: determining an initial stress concentration coefficient by conducting grid discretization on an assessment region, and assigning a value to each of grid nodes using a Weibull distribution function; obtaining a stress concentration coefficient value of each grid node under physics-based models; introducing seismic wave CT detection data to obtain stress concentration coefficient distribution in the assessment region under the integration of a seismic wave CT detection and its derived characterization stress model; introducing microseismic data to obtain stress concentration coefficient distribution in the assessment region under the integration of a microseismic damage reconstruction stress model; and assessing the degree of rock burst hazard according to the size of the stress concentration coefficient value.

10 Claims, 15 Drawing Sheets

PHYSICS-BASED AND DATA-DRIVEN INTEGRATED METHOD FOR ROCK BURST HAZARD ASSESSMENT

CROSS REFERENCE TO RELATED APPLICATION

This patent application claims the benefit and priority of Chinese Patent Application No. 202111337335.9, filed on Nov. 12, 2021, the disclosure of which is incorporated by reference herein in its entirety as part of the present application.

TECHNICAL FIELD

The present disclosure relates to the technical field of rock burst hazard assessment, and in particular to a rock burst hazard assessment method based on the integration of physics-based and data-driven method.

BACKGROUND ART

Due to complexity, abruptness, and variability of rock burst, its monitoring and early warning has always been a common problem plaguing the academia and mining industry. At present, rock burst hazard assessment, monitoring and early warning methods mainly include mining method, mining geophysics, and multi-parameter comprehensive monitoring and early warning. Among them, mining method includes cuttings method, comprehensive index method, coal and stratum burst tendency classification, and numerical simulation analysis, which determine the rock burst hazard according to mining and geological conditions. Mining geophysics mainly includes micro-seismic method, acoustic emission (AE) method and electromagnetic radiation method. The multi-parameter comprehensive monitoring and early warning method to feature mine detection assessment, regional prediction and local early warning are mainly based on the comprehensive index method, seismic wave CT, microseism, acoustic-electric integration and borehole stress monitoring. According to this method, comprehensive index method is intended to assess the rock burst hazard within the range of a mine, and seismic wave CT is intended to detect and assess the rock burst hazard and zoning classification within the mining range of a mine, and to determine key areas; seismic wave CT, bursting strain energy resulting from rock burst and multi-parameters are used to predict the rock burst hazard in key areas to further determine local dangerous area and the type of rock burst; and the acoustic-electric integration and stress monitoring technology is used to achieve immediate early warning and detection of the local dangerous area, and achieve spatial division on the hazard of bursts, hazard classification, independent judgment and identification, real-time early warning and remote professional monitoring through the monitoring and early warning cloud platform.

Although the current research findings have achieved a good application effect, there are few studies on the challenges in rock burst monitoring and early warning, such as relationship between the mechanism of the whole process (birth-initiation-exhibition-end) of rock burst under the coupling of complex multi-field (stress field, fracture field and seepage field) environment and multi-source monitoring parameters, as well as the physics-based mechanism in quantitative characterization of the whole process of rock burst. At the same time, the previous research work mainly considers the integration of monitoring data-driven multi-parameter information, without employing early stress regime and geological structure environment information and late prevention and mining generalization information driven by empirical knowledge and numerical simulation theory. Consequently, as shown in FIG. 1, there is still a long way to go before intelligent assessment, monitoring and early warning on the rock burst hazard can be truly achieved. Therefore, how to correlate and use multi-physical field monitoring parameters to quantitatively characterize the whole process of rock burst, and then capture effective precursory information under combining physics-based and data-driven approaches is to break through the bottleneck of challenge in rock burst hazard assessment and early warning.

SUMMARY

An objective of the present disclosure is to solve the problems in the background art by providing a physics-based and data-driven integrated method for rock burst hazard assessment.

To achieve the above objective, the present disclosure provides the following technical solution: a physics-based and data-driven integrated method for rock burst hazard assessment, including the following steps:

1) determining an initial stress concentration coefficient by conducting grid discretization on an assessment region according to a certain spacing, and assigning a value to each of grid nodes using a Weibull distribution function, where the grid nodes are in a completely homogeneous state by default (m=0), and the value is 1;

2) during assessment of a geological structure of a stope, layout of a roadway, and advancing of a working face, conducting superposition calculation by using different physics-based models to obtain a stress concentration coefficient of each grid node under the physics-based models;

3) introducing seismic wave CT detection data, and correcting the stress concentration coefficient of each grid node by using a seismic wave CT detection and characterization stress model; and 4) introducing microseismic data, further correcting the stress concentration coefficient of each grid node by using a microseismic damage reconstruction stress model, and finally assessing the degree of rock burst hazard according to the size of the stress concentration coefficient value.

Further preferably, the physics-based models include a discrete point stress concentration model, a discrete point stress damage model, a regional stress concentration model, a regional stress damage model, a linear stress concentration model and a linear stress damage model, where model parameters of the physics-based models are @n, m, F, d, and S, @n denotes an identifier of a calculation model, and covers @0, @1, @2, @3, @4 and @5 which respectively correspond to the discrete point stress concentration model, the discrete point stress damage model, the regional stress concentration model, the regional stress damage model, the linear stress concentration model and the linear stress damage model, m and F denote heterogeneity parameters and shape parameters of the Weibull distribution function, d denotes influence distance and range of factor disturbance, and S denotes a spacing of discrete points.

Further preferably, the discrete point stress concentration model, the regional stress concentration model and the linear stress concentration model conduct calculation by adopting a probability density attenuation model, and the discrete point stress damage model, the regional stress damage model and the linear stress damage model conduct calculation through comprehensive use of a probability density attenuation model and a damage mechanics model.

Further preferably, the microseismic damage reconstruction stress model and the seismic wave CT detection and characterization stress model are data-driven models, the microseismic damage reconstruction stress model conducts calculation by introducing microseismic monitoring data and selecting the discrete point stress damage model in the physics-based models, and the seismic wave CT detection and characterization stress model conducts calculation by introducing CT inversion data and selecting the discrete point stress concentration model in the physics-based models.

Further preferably, the probability density attenuation model adopts a normal probability distribution function:

$$S_g(i) = \frac{1}{T}\Sigma g_j \frac{1}{2\pi s^2} \exp\left(\frac{-d_j^2}{2s^2}\right),$$

where $S_g(i)$ denotes a probability density value of a grid node i; s denotes an influence range; $d_j$ denotes a distance from a jth microseismic event or jth discrete point to an ith grid node; $g_j$ denotes an assigned parameter, and when calculation is conducted using a microseismic damage mining-induced stress model, $g_j=\sqrt{E_j}$, where $E_j$ denotes energy of a jth microseismic event; when calculation is conducted using the seismic wave CT detection and characterization stress model, $g_j=F_j$, where $F_j$ denotes a value of a seismic wave CT detection result corresponding to the position of a jth discrete point; and when calculation is conducted using the physics-based models, $g_j=H_j$, where $H_j$ denotes a theoretical assigned value at the position of a jth discrete point.

Further preferably, a calculation formula of the damage mechanics model is as follows:

$$\sigma_i = S_g(i) \cdot (1 - D_i),$$

$$D_i = 1 - \exp\left\{-\frac{S_g(i)}{S_g}\right\},$$

$$S_g = -\frac{\max\{S_g(i)\}}{\ln(1 - D_c)},$$

where $\sigma_i$ denotes an equivalent stress value corresponding to an ith grid node; $D_i$ denotes a damage parameter value of an ith grid node; $S_g$ denotes an average probability density value of an assessment region; $\max\{S_g(i)\}$ denotes the maximum value of $S_g(i)$; and $D_c$ denotes a damage parameter value corresponding to a complete damage state.

Further preferably, for theoretical value assignment at a discrete point $H_j$ in the physics-based models, a value is randomly assigned to each of the discrete points using the Weibull distribution function; where for the discrete point models including the discrete point stress damage model and the discrete point stress concentration model, a manner of direct value assignment is adopted; for the linear models including the linear stress damage model and the linear stress concentration model, a specified line segment first needs to be divided into equidistant discrete points by a certain spacing prior to value assignment in accordance with the discrete point models; and for the regional models including the regional stress damage model and the regional stress concentration model, a specified polygonal area is subject to equidistant gridding by a certain spacing prior to value assignment on each of the grid nodes in accordance with the discrete point models.

Further preferably, a final stress concentration coefficient of each model is calculated by adopting a following calculation formula:

when calculation is conducted using the stress damage models which include the discrete point stress damage model, the regional stress damage model and the linear stress damage model:

$$F_i = \frac{\sigma_i}{\sigma_{max}} \times F,$$

where $\sigma_i$ denotes a stress value corresponding to an ith grid node; $\sigma_{max}$ denotes the maximum stress value corresponding to the grid nodes; $F_i$ denotes a mining-induced stress coefficient parameter value in a selected model; $F_i$ denotes a stress concentration coefficient value corresponding to the ith grid node; where when $F_i<1$ and $$D_i < \frac{1}{3}D_c,$$

1 is assigned to $F_i$; and when calculation is conducted using the stress concentration models including the discrete point stress concentration model, the regional stress concentration model and the linear stress concentration model:

$$F_i = \frac{\sigma_i}{\sigma_{max}} \times (F - 1) + 1,$$

where $\sigma_i$ denotes a stress value corresponding to an ith grid node; $\sigma_{max}$ denotes the maximum stress value corresponding to the grid nodes; F denotes a mining-induced stress coefficient parameter value in a selected model; and $F_i$ denotes a stress concentration coefficient value corresponding to the ith grid node.

Further preferably, in the case of combining the physics-based models, calculation is conducted using a superposition mode, and a calculation formula is as follows:

$F_{i+}=F_{iq} \times F_{i-}$ and further in the case of combining data-driven models, calculation is conducted using a correction mode, and a calculation formula is as follows:

$$F_{i+}=\sqrt{F_{iq} \times F_{i-}},$$

where $F_{i+}$ denotes a stress concentration factor value corresponding an ith grid node after the superposition update; $F_{iq}$ denotes a stress concentration coefficient value corresponding to the ith grid node under a result calculated by the model at the current step; and $F_{i-}$ denotes a stress concentration coefficient value corresponding to the ith grid node calculated by the model at the previous step.

Further preferably, grid discretization is conducted by using S as a grid spacing.

The present disclosure has the following beneficial effects: the calculation formulas pertaining to mining-induced stress and mining-induced stress concentration coefficient have significant physical and mechanical significance, where parameters involved in the formula are clearly calculated, and the method possesses high universality and operability, and is suitable for programming and high in application feasibility; the calculation process involves a wide-range geological structures of a mine, mining activities, real-time monitoring of microseismic data, as well as seismic wave CT inversion data. Meanwhile, the timeliness is high, wide-range and nearly real-time inversion of mining-induced stress concentration coefficient distribution during coal seam mining can be achieved, thereby allowing for daily monitoring and early warning. Therefore, the method has very high practical value and vital practical significance.

DETAILED DESCRIPTION OF THE EMBODIMENTS

Figure 1:
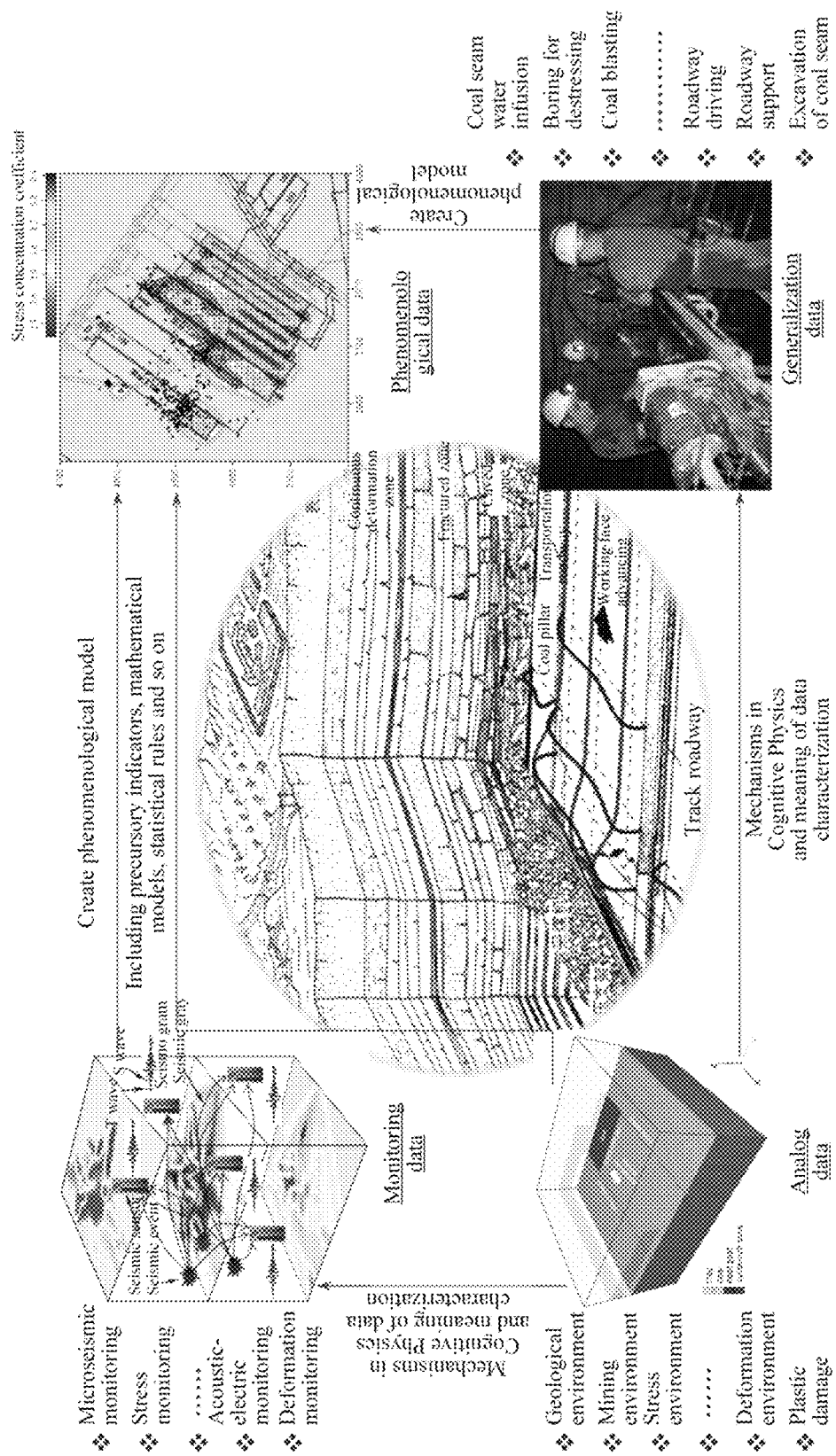
FIG. 1 is a schematic diagram illustrating integration of physics-based and data-driven concept in an environment of coal mining.

The technical solutions of the present disclosure are described in further detail below with reference to the specific examples and accompanying drawings, but the present disclosure is not limited thereto.

Based on stress characterization information, such as the original stress regime and geological structure environment information and the ongoing prevention and mining generalization information, driven by empirical knowledge and numerical simulation theory, in combination with the stress characterization information such as the damage reconstruction mining-induced stress driven by the microseismic monitoring data and the wave velocity distribution detected by seismic wave CT, a rock burst hazard assessment method based on integration of physics-based and data-driven models is established by adopting the Weibull distribution, normal probability density distribution and other mathematical phenomenological models. These are used for quantitative characterization and correlation, thereby realizing nearly real-time inversion of mining-induced stress concentration coefficient in the process of coal mining. The physics-based models include a discrete point stress concentration model, a discrete point stress damage model, a regional stress concentration model, a regional stress damage model, a linear stress concentration model and a linear stress damage model; and the data-driven models include a microseismic damage reconstruction stress model and a seismic wave CT detection and characterization stress model. The method includes the following steps:

1) firstly, determining an initial stress concentration coefficient by conducting grid discretization on an assessment region according to a certain spacing, and assigning a value to each of grid nodes using a Weibull distribution function, where grid discretization is conducted by using S as a grid spacing, the grid nodes are in a completely homogeneous state by default (m=0), and the value is 1;

2) during assessment of a geological structure of a mining district, layout of a roadway, and advancing of a working face, conducting superposition calculation by using different physics-based models (discrete point stress concentration model, discrete point stress damage model, regional stress concentration model, regional stress damage model, linear stress concentration model and linear stress damage model) to obtain a stress concentration coefficient of each grid node under the physics-based models;

3) on the basis of obtaining stress concentration coefficient distribution under the physics-based models, introducing seismic wave CT detection data, the stress concentration coefficient of each grid node can be corrected by using a seismic wave CT detection and its derived characterization stress model to obtain stress concentration coefficient distribution of the assessment region, and thereby achieve the coupled stress under the integration of the seismic wave CT detection and characterization stress model; and 4) further introducing microseismic data, on the basis of stress concentration coefficient distribution in the assessment region under the integration of the seismic wave CT detection and characterization stress model, a stress concentration coefficient value of each grid node in the assessment region can be calculated under the integration of physics-based and data-driven models by using the microseismic damage reconstruction stress model, so as to obtain spatial distribution information of stress concentration coefficients in the assessment region, and finally, obtain a distribution diagram of relative stress concentration coefficients in the assessment region by using the distribution information, which provides guidance for mine safety design.

According to the present disclosure, model parameters of the physics-based models are @n, m, F, d, and S, @n denotes an identifier of a calculation model, and covers @0, @1, @2, @3, @4 and @5 which respectively correspond to the discrete point stress concentration model, the discrete point stress damage model, the regional stress concentration model, the regional stress damage model, the linear stress concentration model and the linear stress damage model, m and F denote heterogeneity parameters and shape parameters of the Weibull distribution function, d denotes influence distance and range of factor disturbance, and S denotes a spacing of discrete points.

Figure 3:
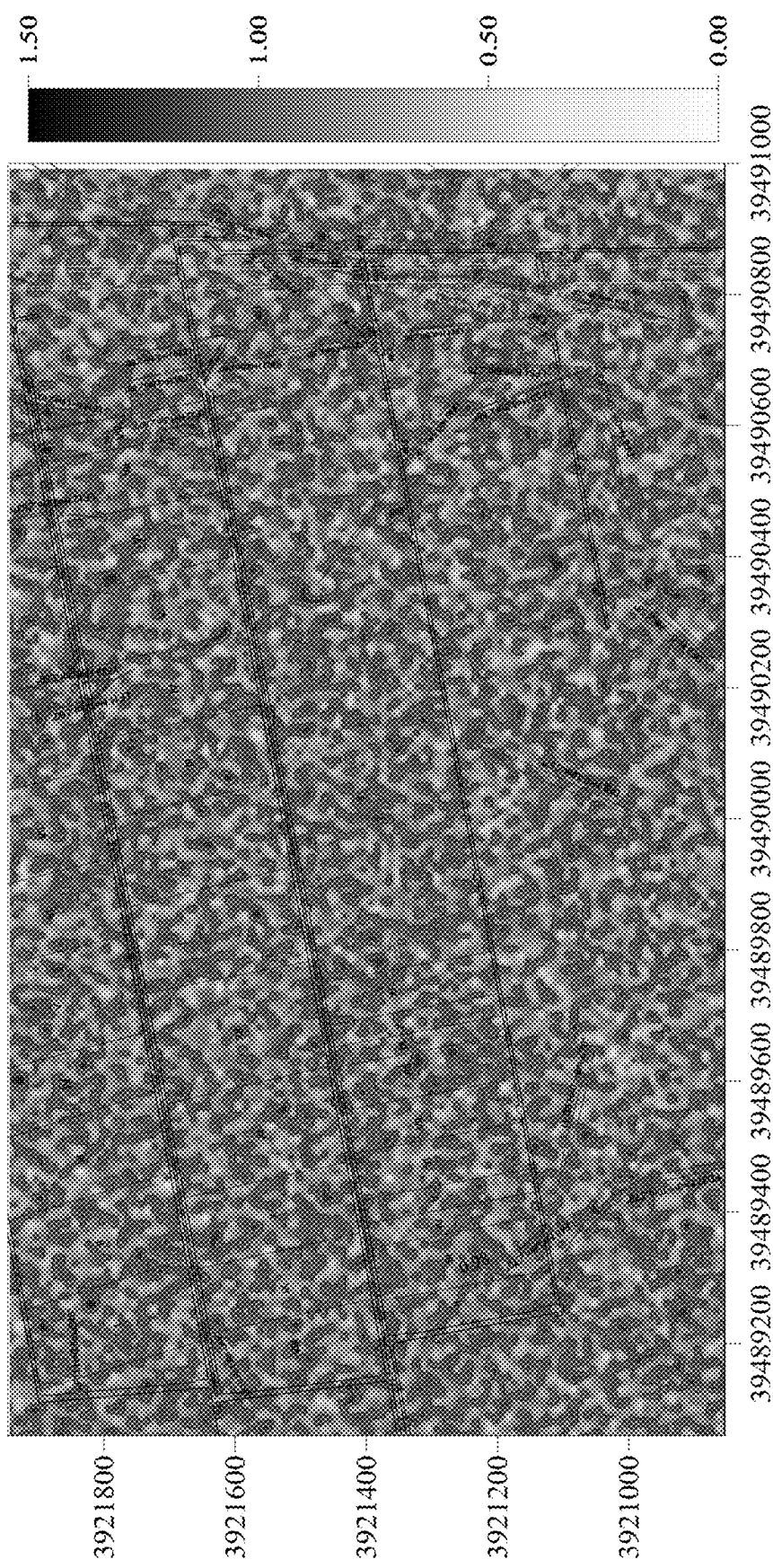
FIG. 3 is an effect diagram of a heterogeneous initial stress concentration coefficient model.

According to the present disclosure, the models used are based on a homogeneous initial model (m=0) for superposed fusion calculation. If a heterogeneous model, such as m=5, is used, the effect thereof is shown in FIG. 3. The following shows calculation examples of discrete point stress concentration model, discrete point stress damage model, regional stress concentration model, regional stress damage model, linear stress concentration model and linear stress damage model:

Example 1. Discrete Point Stress Concentration Model @0,3, 1.3, 50

Figure 4:
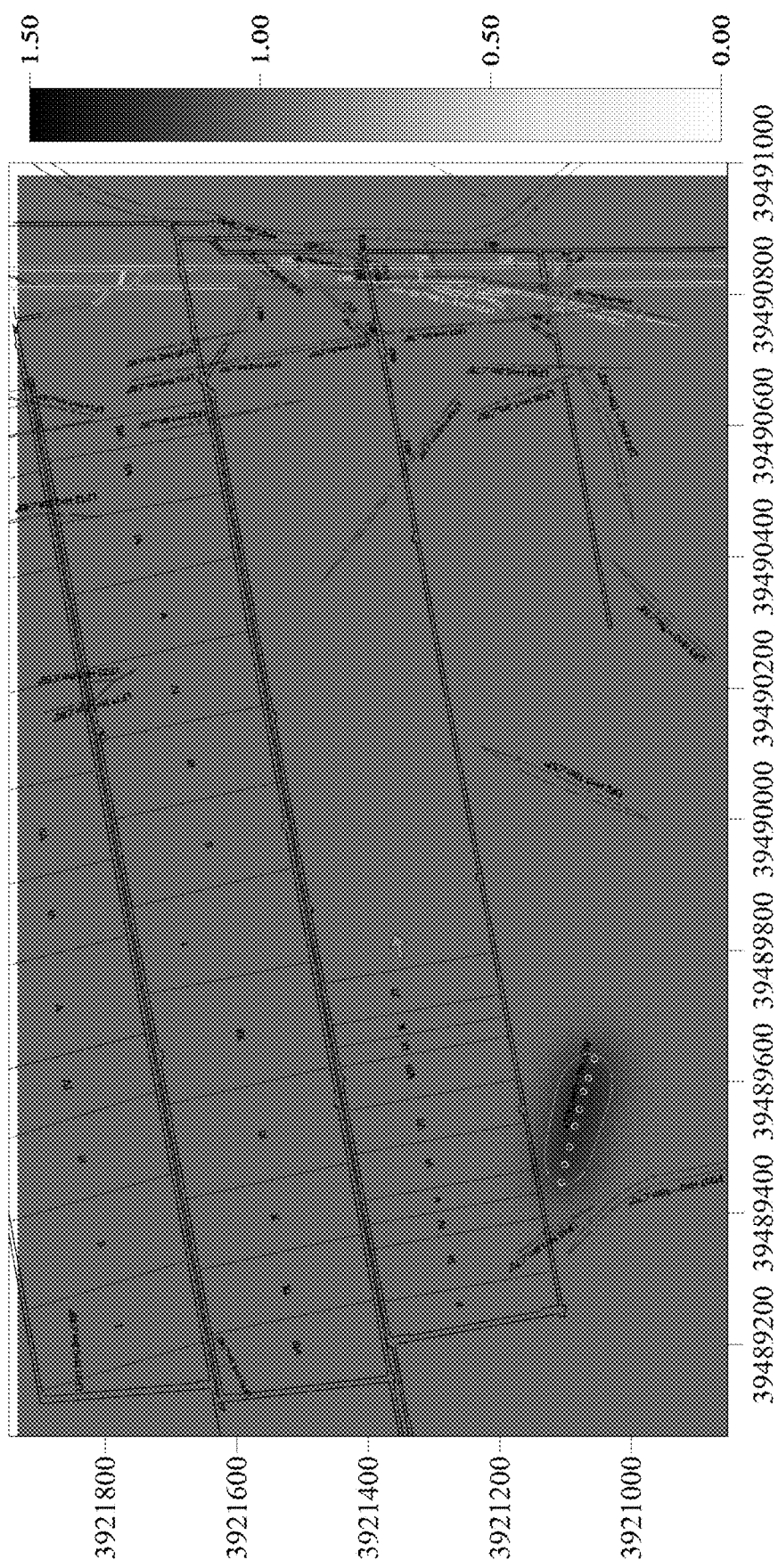
FIG. 4 is an effect diagram of a discrete point stress concentration model.

The calculation model adopts a probability density attenuation model, which is suitable for stress anomaly regions such as faults and complex coal pillars, and discrete points are arranged to cover such stress anomaly regions. The calculation effect of the model is shown in FIG. 4, where the points in white circle are the discrete points arranged by the model.

Example 2. Discrete Point Stress Damage Model @1, 4, 1.7, 100

Figure 5:
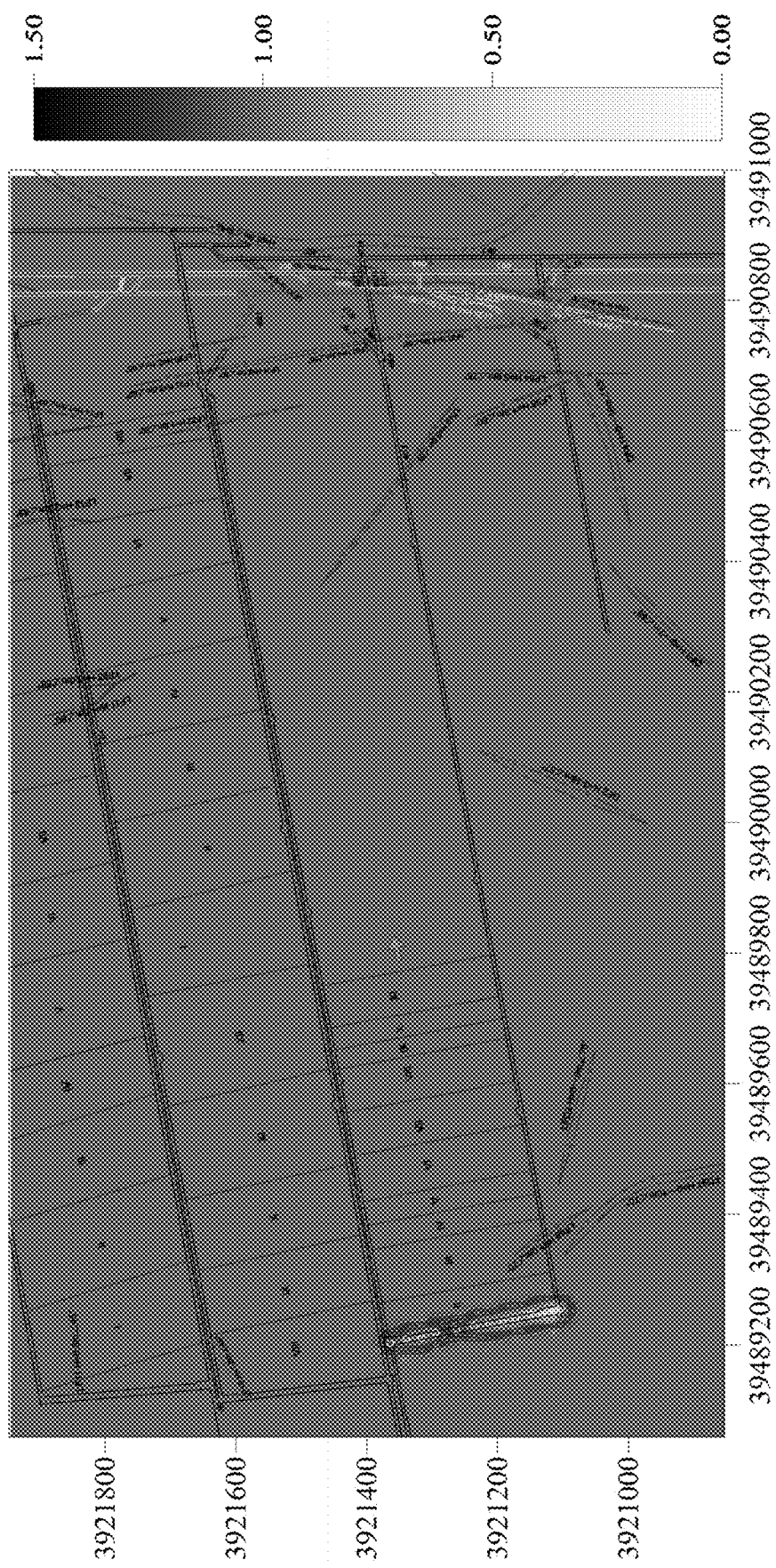
FIG. 5 is an effect diagram of a discrete point stress damage model.

The calculation model comprehensively adopts a damage mechanics model and a probability density attenuation model, which is suitable for a microseismic reconstruction mining-induced stress model and a complex goaf stress model. Discrete points are arranged to cover complex goaf, roadway and other areas. The calculation effect of the model is shown in FIG. 5, where the points in white circle are the discrete points arranged by the model.

Example 3. Regional Stress Concentration Model @2, 5, 1.2, 20, 5

Figure 6:
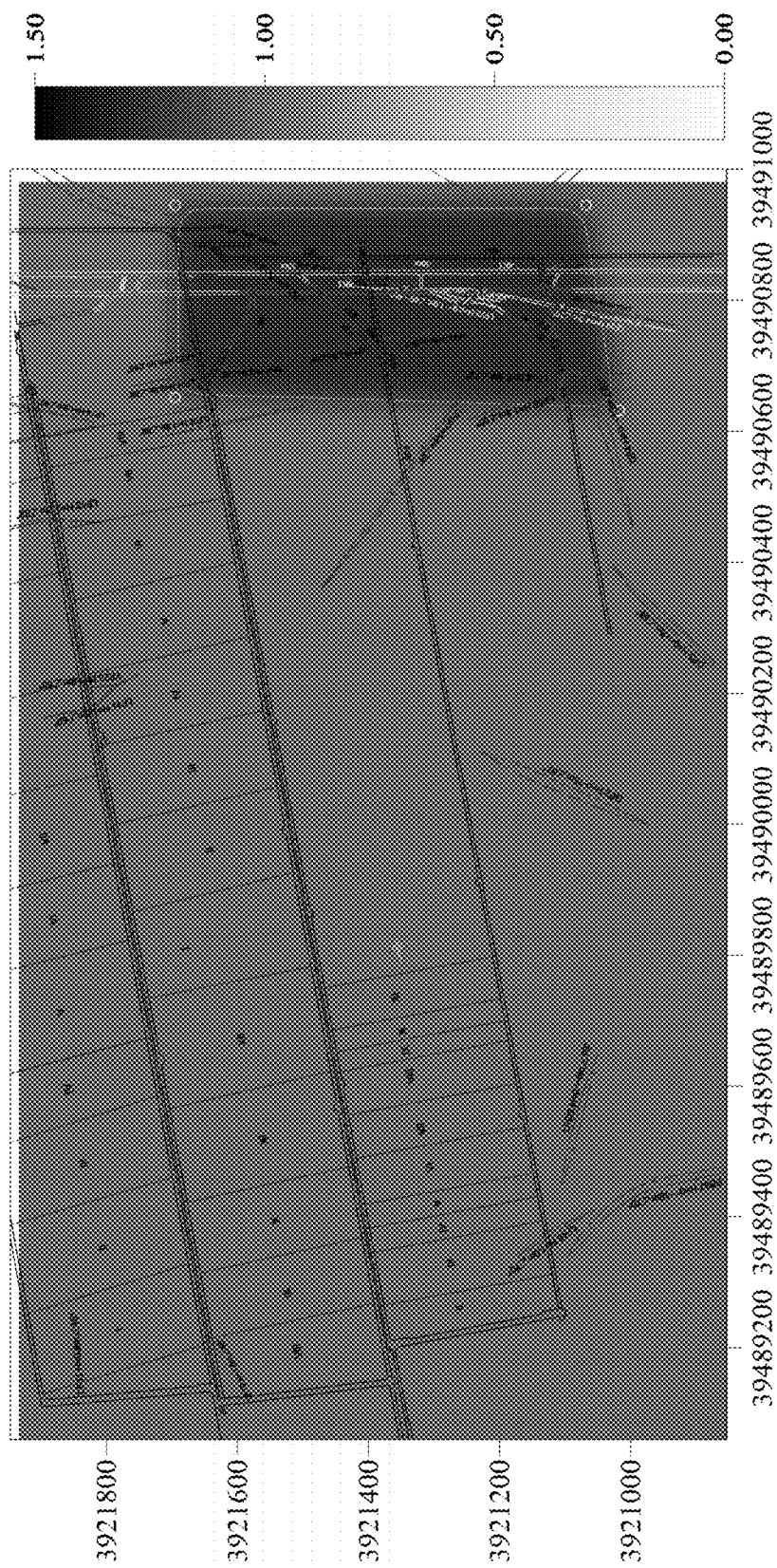
FIG. 6 is an effect diagram of a regional stress concentration model.

The calculation model adopts a probability density attenuation model, which is suitable for stress anomaly regions such as roadway concentration regions and coal pillars. Boundary points are used to delineate such stress anomaly regions, and discrete points are arranged at equal intervals in the regions. The calculation effect of the model is shown in FIG. 6, where the points in white circle are the selected boundary points to delineate the coal pillars.

Example 4. Regional Stress Damage Model @3, 21, 1.2, 20, 5

Figure 7:
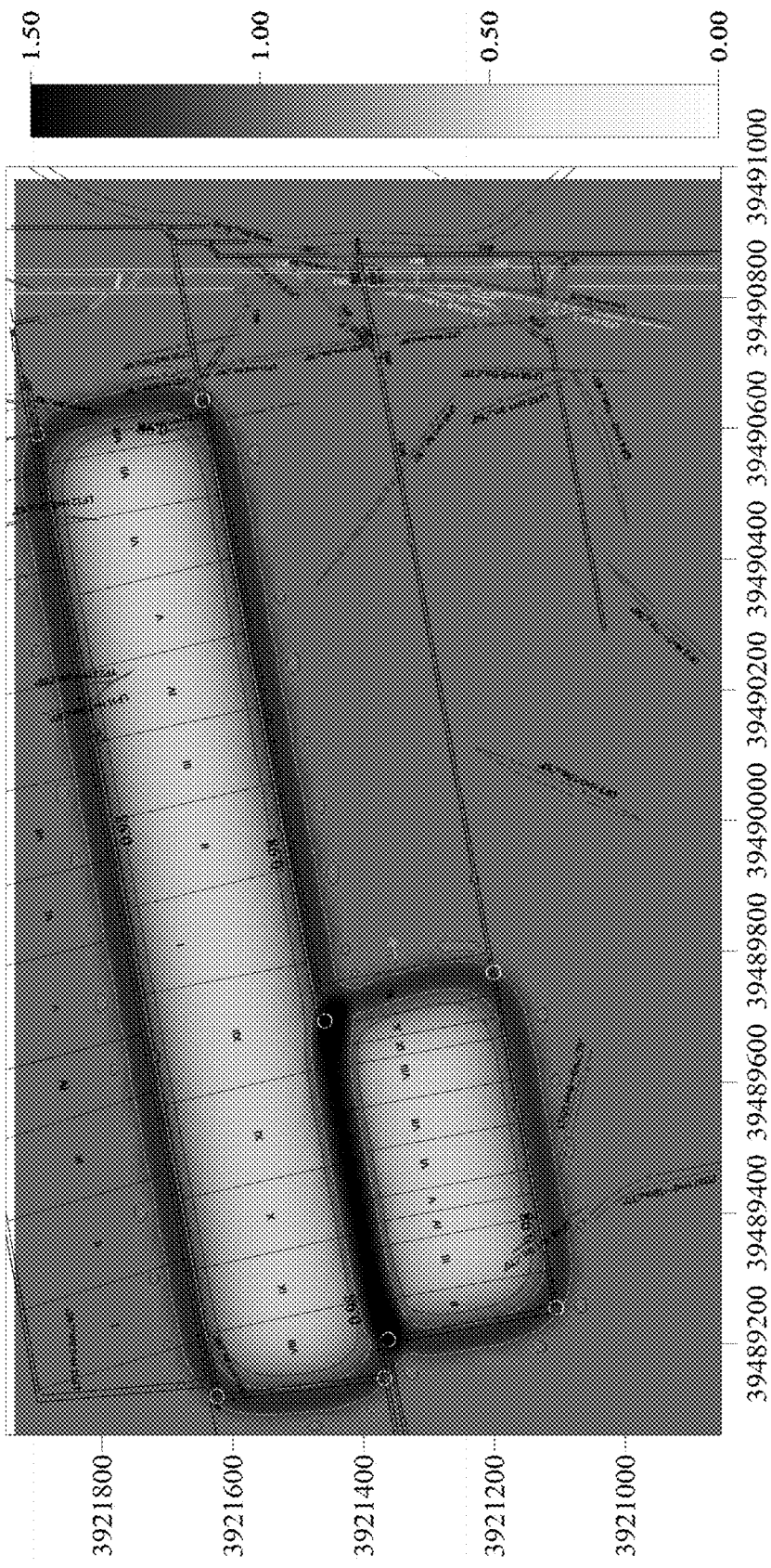
FIG. 7 is an effect diagram of a regional stress damage model.

The calculation model comprehensively adopts a damage mechanics model and a probability density attenuation model, which is suitable for predicting damage stress in a goaf. Boundary points are used to delineate the goaf and other region, and discrete points are arranged at equal intervals in the regions. The calculation effect of the model is shown in FIG. 7, where the points in white circle are the selected boundary points to delineate the region of goaf.

Example 5. Linear Stress Concentration Model @4, 9, 2.0, 20, 1

Figure 8:
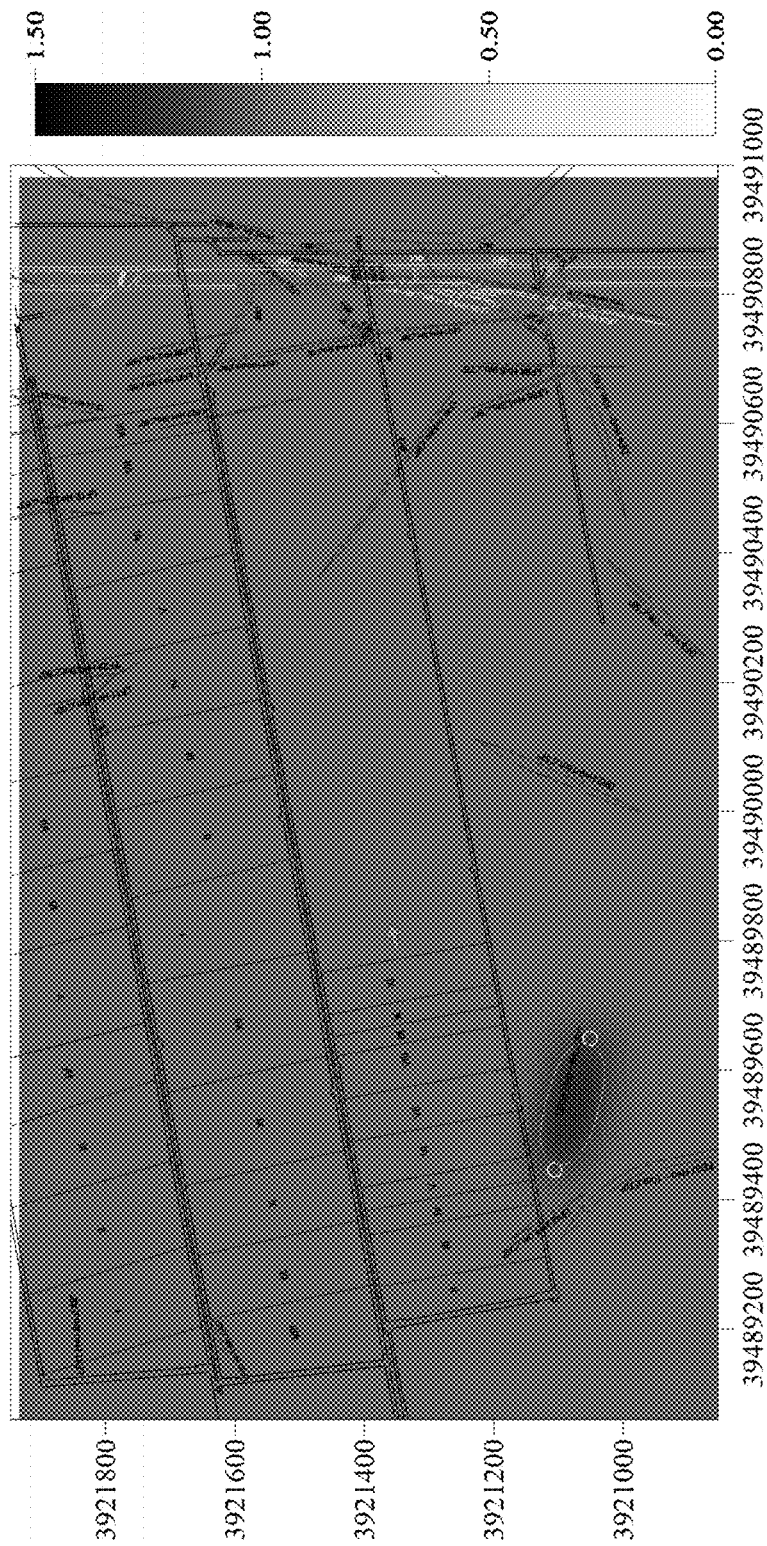
FIG. 8 is an effect diagram of a linear stress concentration model.

The calculation model adopts a probability density attenuation model, which is suitable for the linear characteristics of regions with fault structure anomaly. Endpoints of line segments are used to determine the linear regions such as faults, and discrete points are arranged at equal intervals on the line segments. The calculation effect of the model is shown in FIG. 8, where the points in white circle are the selected line endpoint to determine the fault regions.

Example 6. Linear Stress Damage Model @5, 9, 2.0, 20, 1

Figure 9:
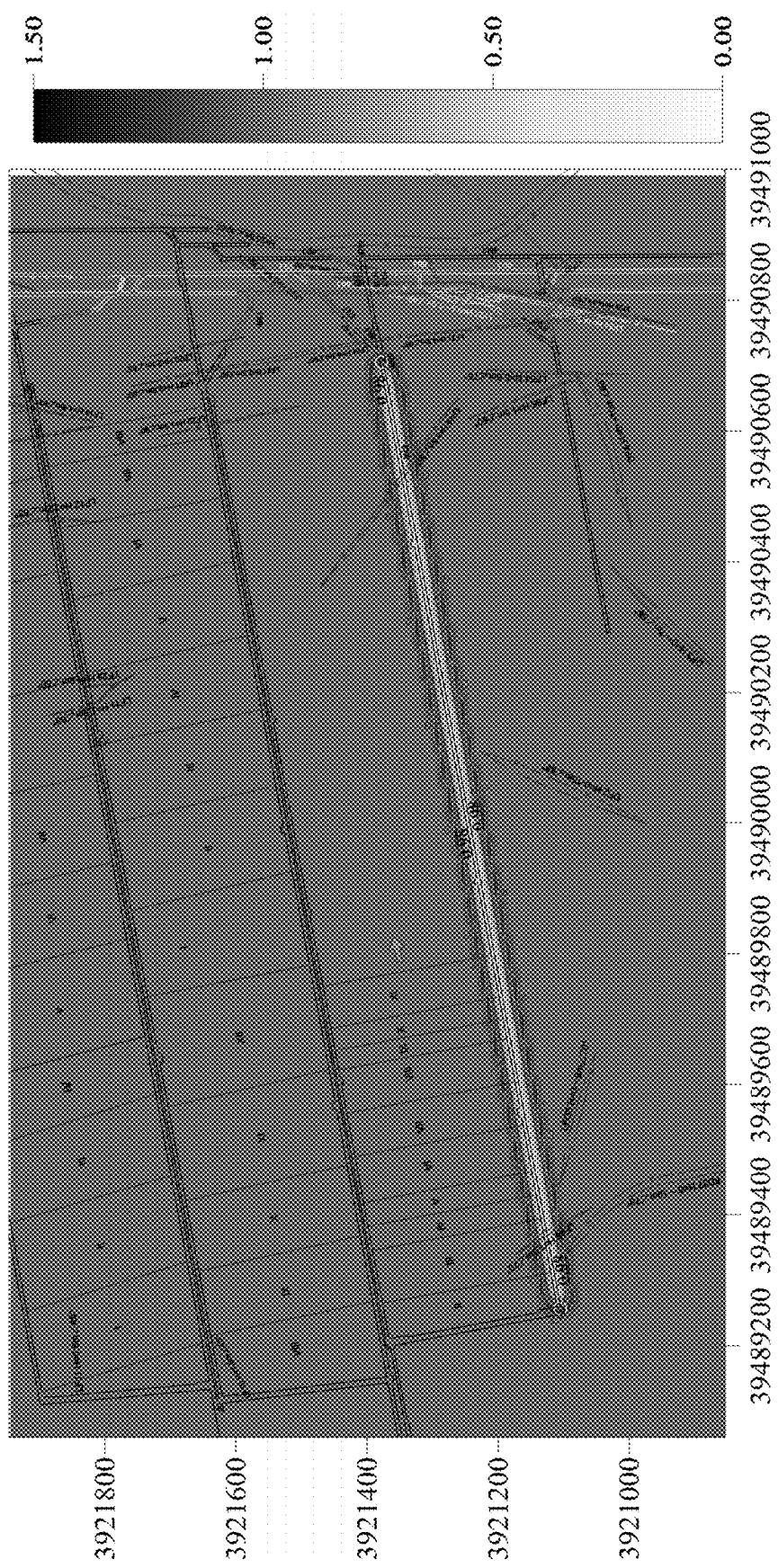
FIG. 9 is an effect diagram of a linear stress damage model.

The calculation model adopts a damage mechanics model and a probability density attenuation model, which is mainly suitable for roadways, large-diameter boreholes, roadways determined by endpoints of multiple line segments, and other areas. Discrete points are arranged at equal intervals on the line segments. The calculation effect of the model is shown in FIG. 9, where the points in white circle are the selected line segment endpoints to determine the region of roadway.

According to the present disclosure, the microseismic damage reconstruction stress model conducts calculation by introducing microseismic monitoring data and selecting the discrete point stress damage model in the physics-based models, and the seismic wave CT detection and characterization stress model conducts calculation by introducing seismic CT inversion data and selecting the discrete point stress concentration model in the physics-based models, such as @0, −1, 2.5, 13, and the second-order digit in the discrete point stress concentration model is defined as −1 for identification of the calculation of the seismic wave CT detection and characterization stress model.

According to the present disclosure, the probability density attenuation model adopts a normal probability distribution function:

$$S_g(i) = \frac{1}{T}\Sigma g_j \frac{1}{2\pi s^2} \exp\left(\frac{-d_j^2}{2s^2}\right),$$

where $S_g(i)$ denotes a probability density value of a grid node i; s denotes an influence range; $d_j$ denotes a distance from a jth microseismic event or jth discrete point to an ith grid node; $g_j$ denotes a statistical parameter, and when calculation is conducted using a microseismic damage mining-induced stress model, $g_j=\sqrt{E_j}$, where $E_j$ denotes energy of a jth microseismic event; when calculation is conducted using the physics-based models and the seismic wave CT detection and characterization stress model, $g_j=F_j$, where $F_j$ denotes a stress concentration coefficient value assigned to a jth discrete point; and when calculation is conducted using the physics-based models, $g_j=H_j$, where $H_j$ denotes a theoretical assigned value at the position of a jth discrete point; and the mining-induced stress value of each grid node in the assessment region is determined, so as to determine the stress concentration coefficient value of each grid node in the assessment region.

According to the present disclosure, a calculation formula of the damage mechanics model is as follows:

$$\sigma_i = S_g(i) \cdot (1 - D_i),$$

-continued $$D_i = 1 - \exp\left\{-\frac{S_g(i)}{S_g}\right\},$$

$$S_g = -\frac{\max\{S_g(i)\}}{\ln(1 - D_c)},$$

where $\sigma_i$ denotes an equivalent stress value corresponding to an ith grid node; $D_i$ denotes a damage parameter value of an ith grid node; $S_g$ denotes an average probability density value of an assessment region; $\max\{S_g(i)\}$ denotes a maximum value of $S_g(i)$; and $D_c$ denotes a damage parameter value corresponding to a complete damage state, where the optimal effect is achieved when 0.99 is assigned to $D_c$.

According to the present disclosure, by determining the mining-induced stress value of each of grid nodes in the assessment region, the stress concentration coefficient value of each grid node in the assessment region under physics-based models is determined, and the final stress concentration coefficient of each model is calculated by the following formula:

when calculation is conducted using the stress damage models which include the discrete point stress damage model, the regional stress damage model and the linear stress damage model, the calculation formula is as follows:

$$F_i = \frac{\sigma_i}{\sigma_{max}} \times F,$$

where $\sigma_i$ denotes a stress value corresponding to an ith grid node; $\sigma_{max}$ denotes the maximum stress value corresponding to the grid node; F denotes a mining-induced stress coefficient value in a selected model; $F_i$ denotes a stress concentration coefficient value corresponding to the ith grid node; where when $F_i<1$ and $$D_i < \frac{1}{3}D_c,$$

Figure 2:
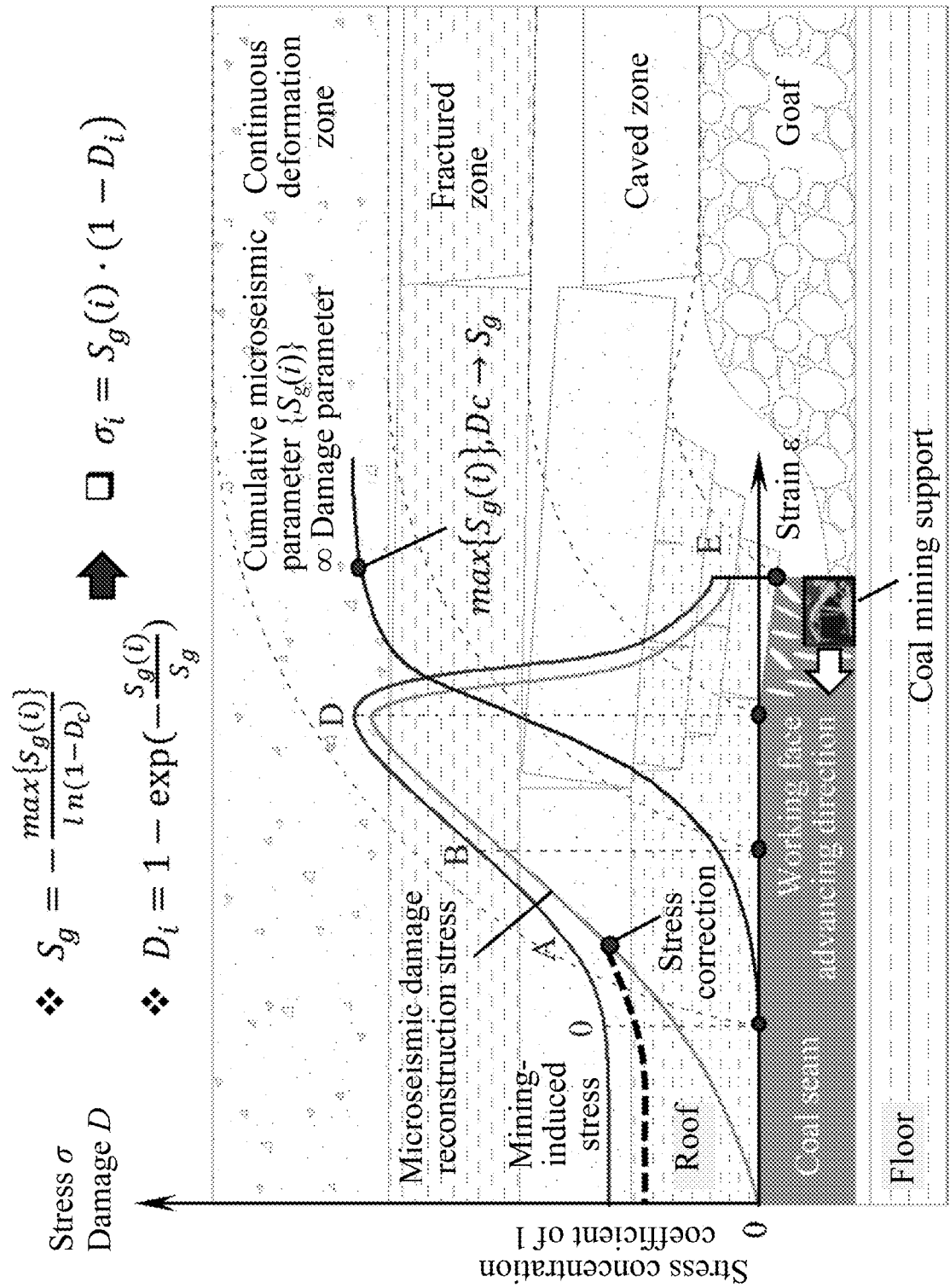
FIG. 2 is a schematic diagram of an assessment method for a mining-induced stress concentration coefficient according to the present disclosure.

1 is assigned to $F_i$, and an optimal effect is achieved, as shown in FIG. 2; and when calculation is conducted using the stress concentration models including the discrete point stress concentration model, the regional stress concentration model and the linear stress concentration model, the calculation formula is as follows:

$$F_i = \frac{\sigma_i}{\sigma_{max}} \times (F - 1) + 1,$$

where $\sigma_i$ denotes a stress value corresponding to an ith grid node; $\sigma_{max}$ denotes the maximum stress value corresponding to the grid node; F denotes a mining-induced stress coefficient value in a selected model; and $F_i$ denotes a stress concentration coefficient value corresponding to the ith grid node.

According to the present disclosure, in the case of combining the physics-based models, calculation is conducted using a superposition mode, and a calculation formula is as follows:

$$F_{i+} = F_{iq} \times F_{i-},$$

in the case of combining the physics-based models and the data-driven models such as the microseismic damage reconstruction stress model and the seismic wave CT detection and characterization stress model, calculation is conducted using a correction mode, and a calculation formula is as follows:

$$F_{i+} = \sqrt{F_{iq} \times F_{i-}},$$

where $F_{i+}$ denotes a stress concentration factor value corresponding an ith grid node after the integration update; $F_{iq}$ denotes a stress concentration coefficient value corresponding to the ith grid node under a result calculated by the model at the current step; and $F_{i-}$ denotes a stress concentration coefficient value corresponding to the ith grid node calculated by the model at the previous step.

EMBODIMENT

The microseismic monitoring data, seismic wave CT inversion data of a working face of a coal mine in the mining stage, and geological structure distribution and mining layout of an assessment region are selected for analysis.

Figure 10:
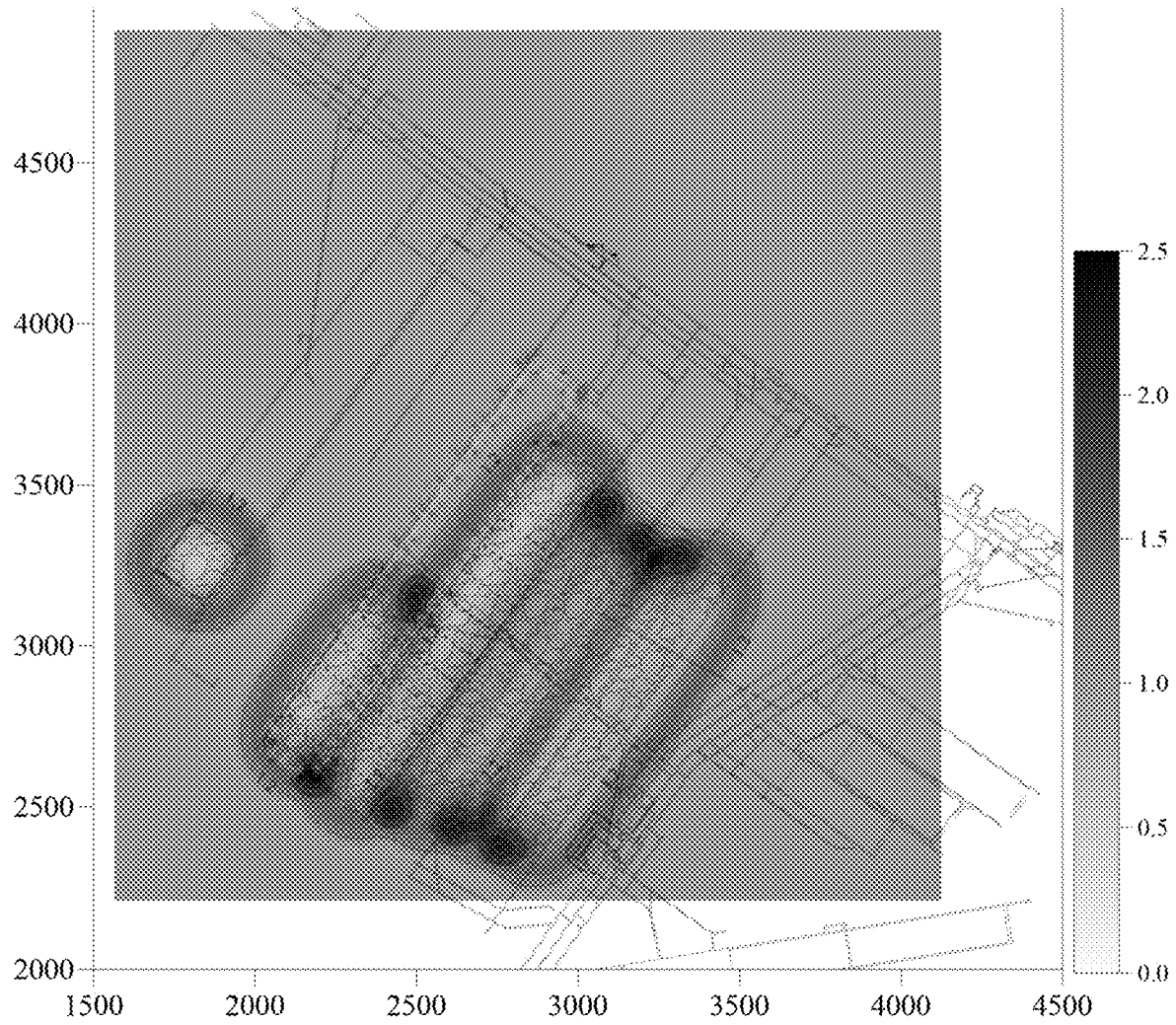
FIG. 10 is a mining-induced stress concentration coefficient distribution diagram based on physics-based models.

(1) Determine an assessment region of a mine, conduct grid discretization on the assessment region, take the grid spacing S as 10 m, assign 1 to the stress concentration coefficient of each grid node using the homogeneous model, and obtain the initial stress concentration coefficient of the assessment region;

(2) According to the geological structure distribution of the assessment region, select different physics-based models for calculation; for roadway driving and mined area of the working face, use linear stress damage model @5, 21, 1.3, 15, 2 and regional stress damage model @3, 21, 1.5, 100, 5 respectively for calculation, so as to obtain the stress concentration coefficient distribution in the assessment region under the physics-based model, as shown in FIG. 10.

Figure 11:
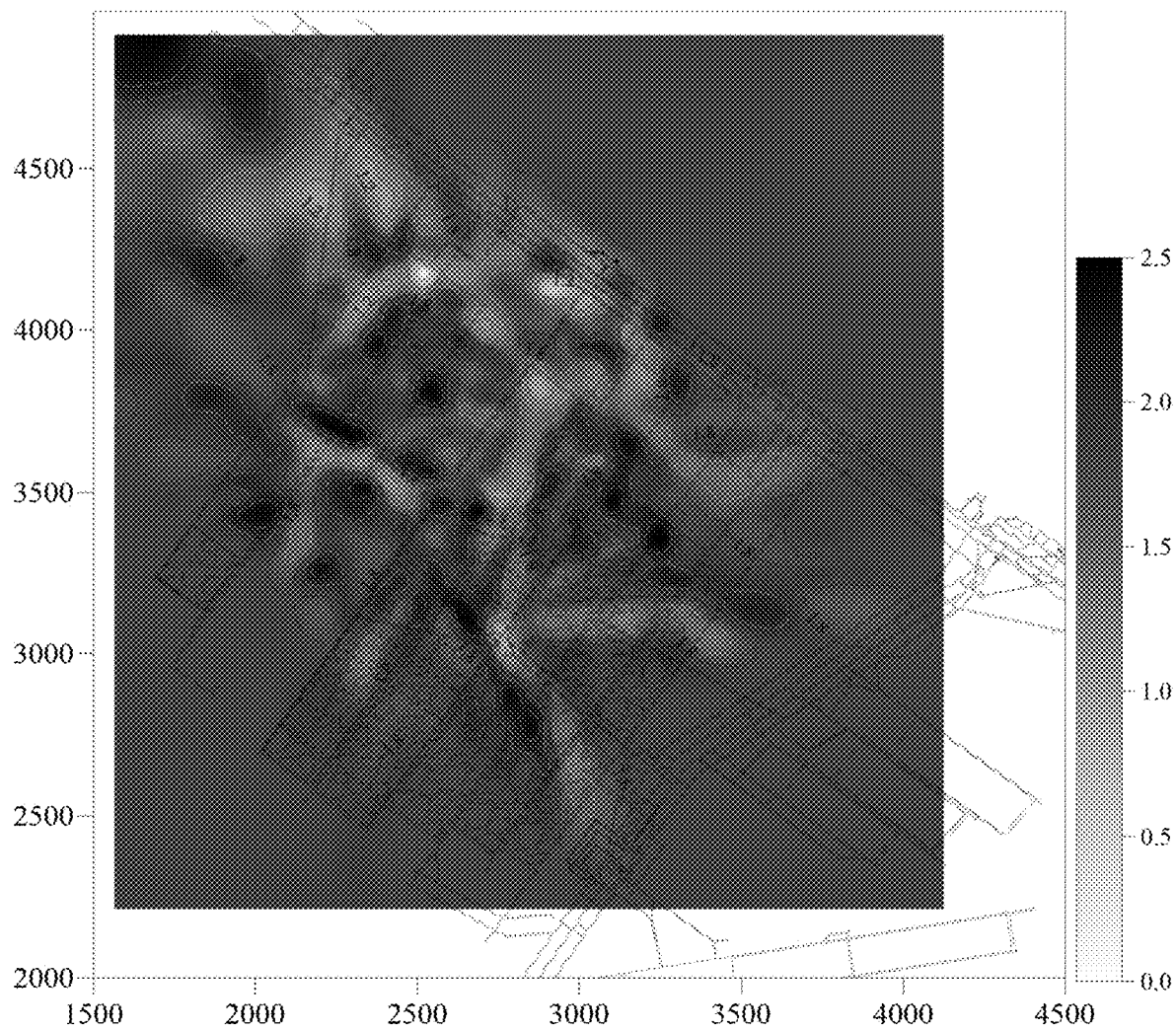
FIG. 11 is a stress concentration distribution diagram based on a seismic wave CT detection and characterization stress model.
Figure 12:
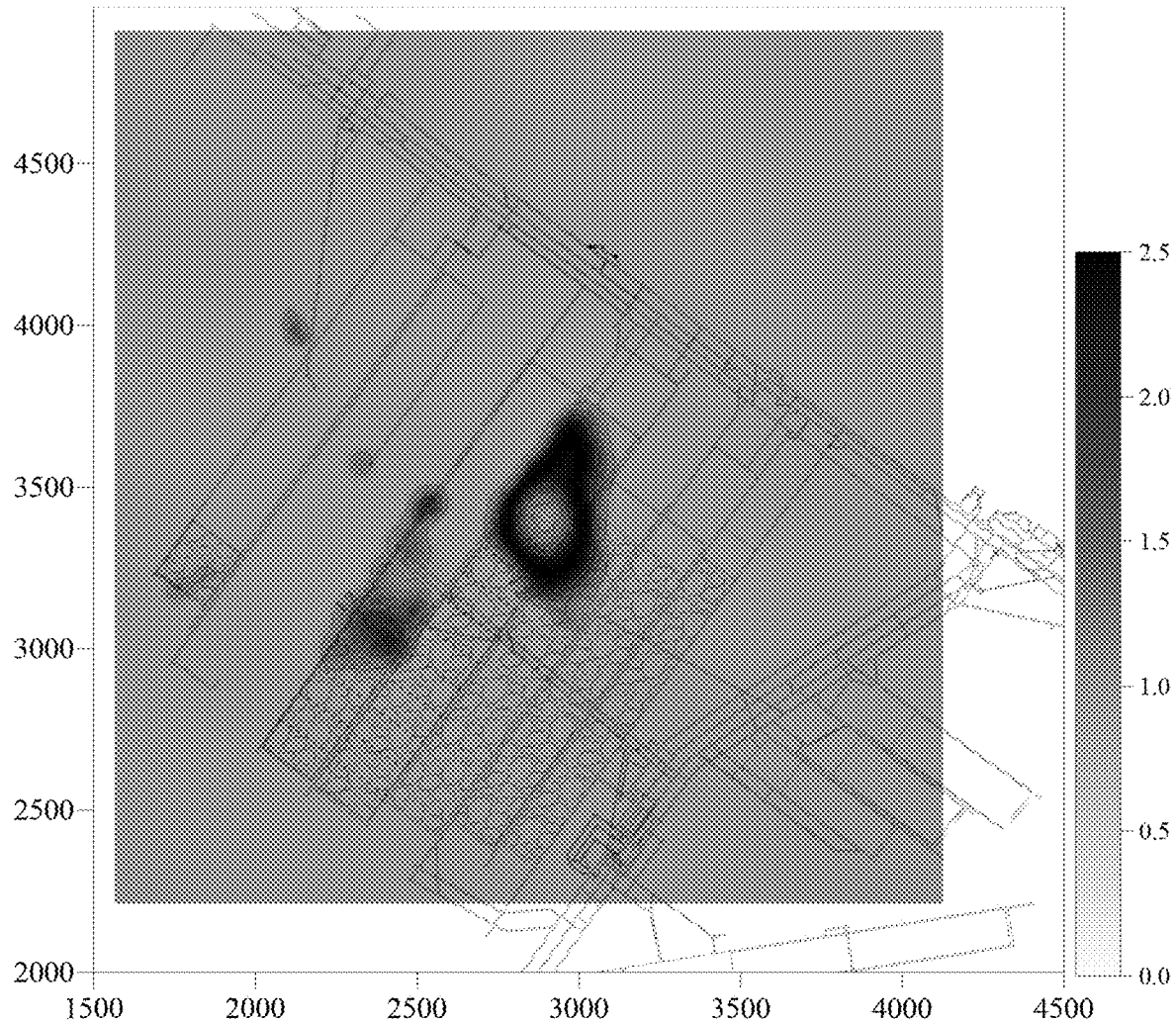
FIG. 12 is a stress concentration distribution diagram based on a microseismic damage reconstruction stress model.
Figure 13:
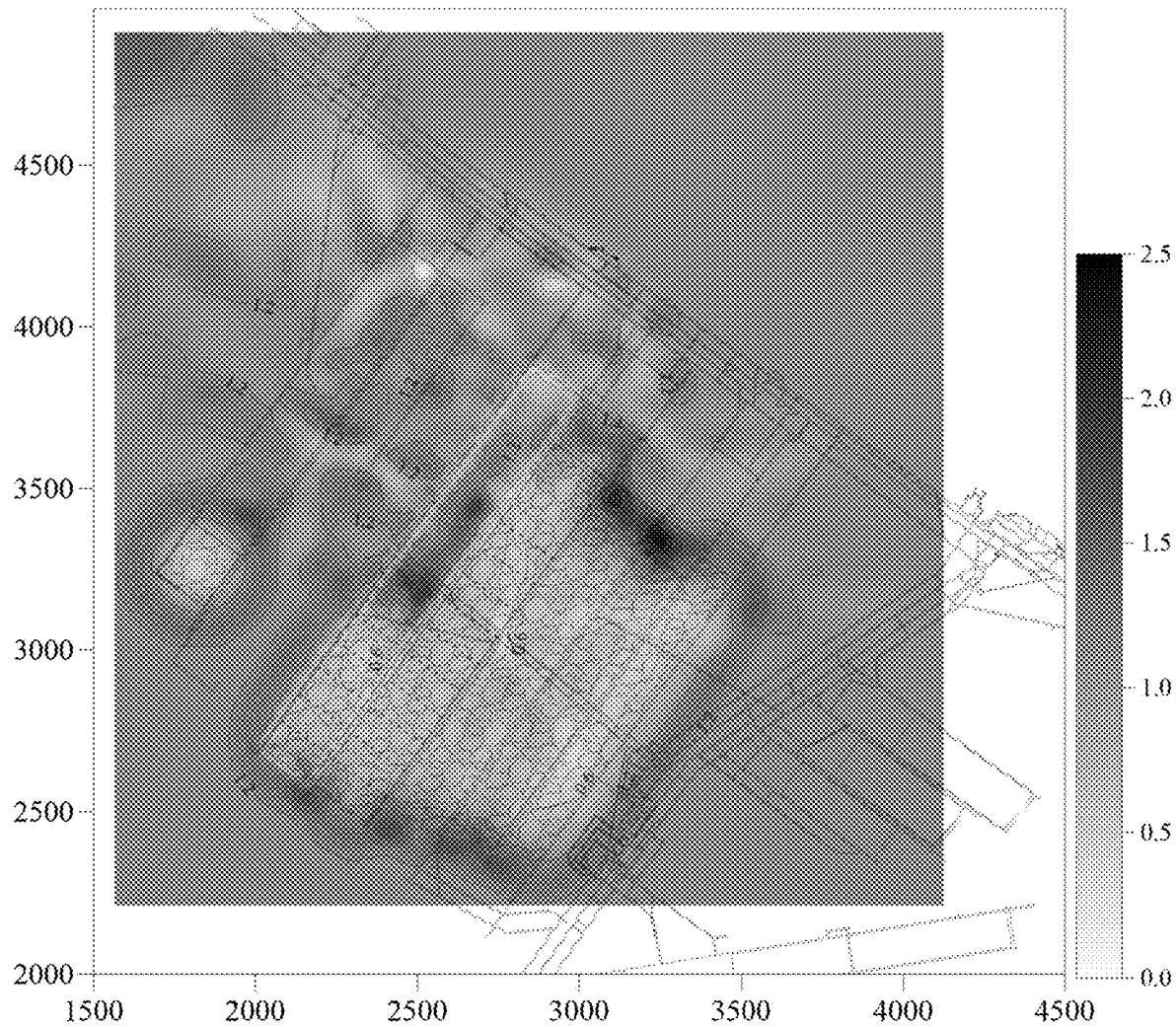
FIG. 13 is a stress concentration distribution diagram based on integration of physics-based models and the seismic wave CT detection and characterization stress model.
Figure 14:
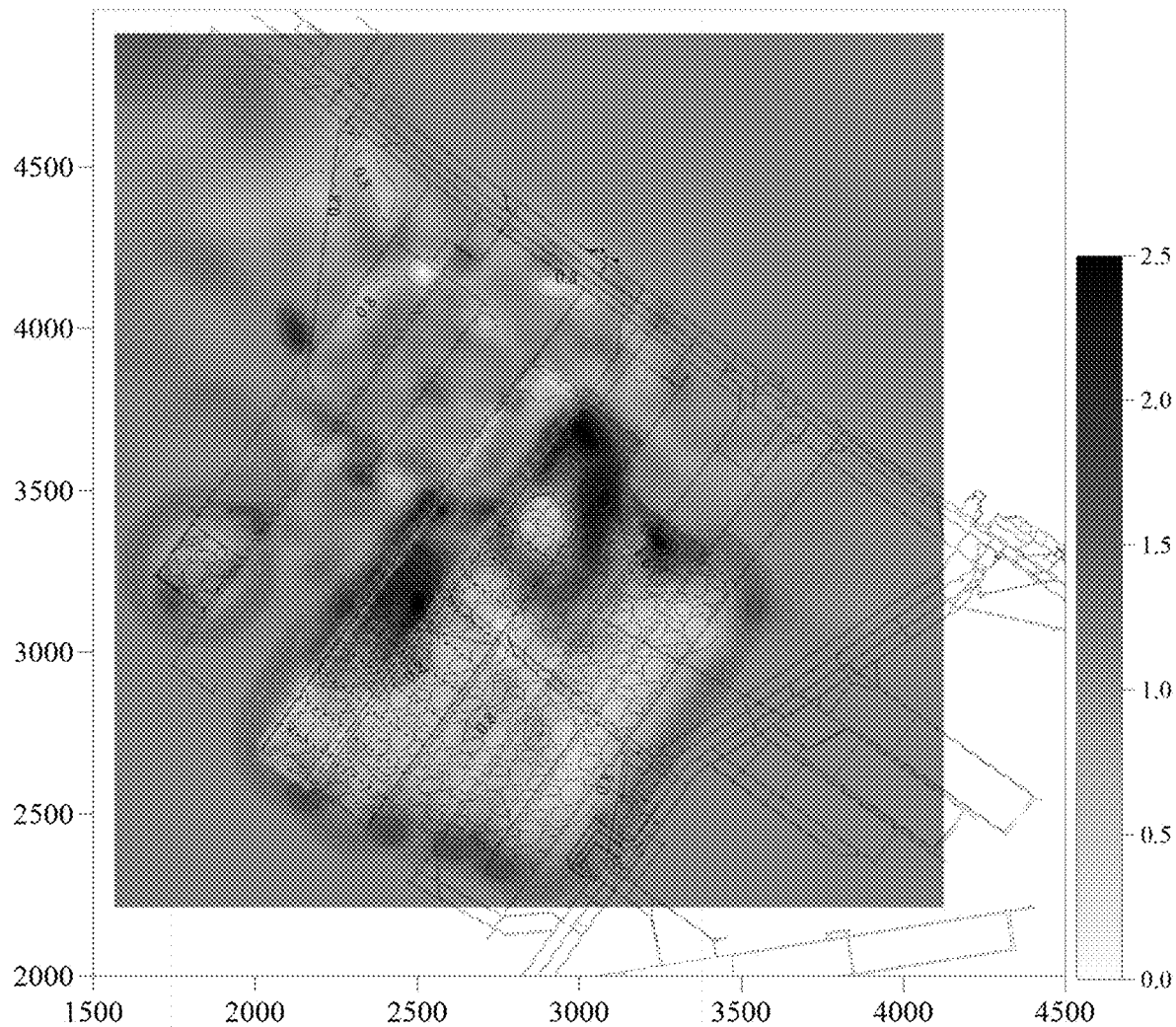
FIG. 14 is a stress concentration coefficient distribution diagram under integration of physics-based and data-driven models.
Figure 15:
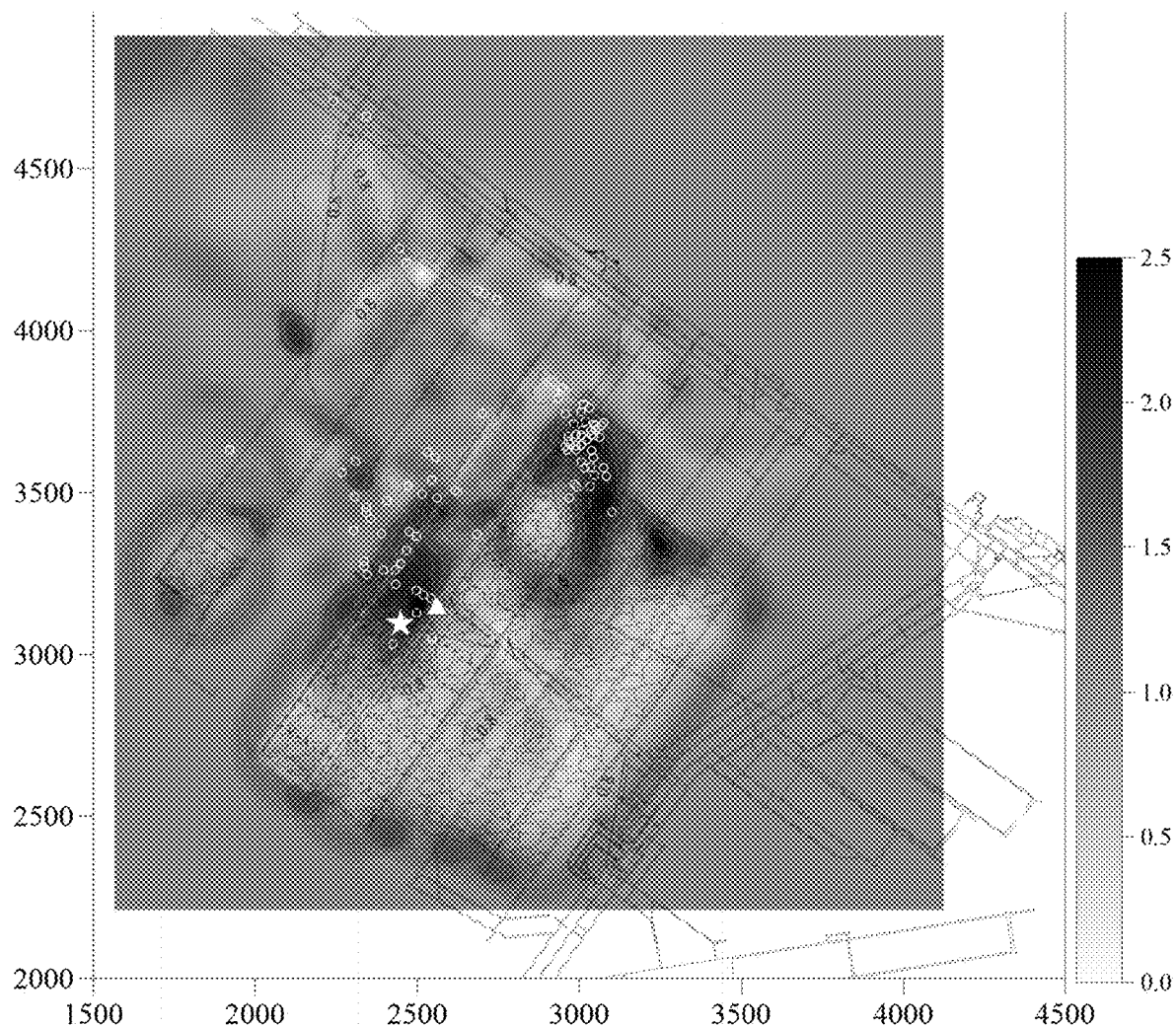
FIG. 15 is a microseismic event superposition distribution diagram used for prediction and verification of model results.

(3) on the basis of the results of the initial stress concentration coefficient distribution in the assessment region, introduce seismic wave CT inversion data, and select the seismic wave CT detection and characterization stress model @0, −1, 2.5, 13 for calculation, so as to obtain stress concentration distribution under the seismic wave CT detection and its derived characterization stress model, as shown in FIG. 11;

(4) on the basis of the results of the initial stress concentration coefficient distribution in the assessment region, introduce microseismic monitoring data, conduct calculation using the microseismic damage reconstruction stress model, and select 4.0 as the microseismic mining-induced stress concentration coefficient to obtain stress concentration distribution under the microseismic damage reconstruction stress model, as shown in FIG. 12;

(5) on the basis of stress concentration coefficient distribution in the assessment region under the physics-based models, introduce seismic wave CT inversion data, and select a seismic wave CT detection and its derived characterization stress model @0, −1, 2.5, 13 for calculation, so as to obtain stress concentration distribution in the assessment region under the integration of the physics-based models and seismic wave CT detection and characterization, as shown in FIG. 13;

(6) on the basis of the stress concentration distribution in the assessment region under the integration of the physics-based models and seismic wave CT detection and characterization, introduce microseismic monitoring data, conduct calculation based on the microseismic damage reconstruction stress model, and take 2.5 as the microseismic mining-induced stress concentration coefficient to obtain stress concentration coefficient distribution under the integration of physics-based and data-driven models, as shown in FIG. 14; and (7) the rock burst seismic source on the next day (represented by five-pointed star), the manifestation location of rock burst (represented by triangle) and all microseismic events fall on FIG. 14 as scattered points to verify the distribution results of stress concentration coefficients under the integrated of physics-based and data-driven models, as shown in FIG. 15.

The examples show that the parameters involved in the present disclosure are clearly calculated, universality and operability are high, at the same time, the distribution of mining-induced stress calculated by inversion is reasonable and the effect is good, which can realize the nearly real-time assessment on the rock burst hazard.

Finally, it should be noted that the above descriptions are only preferred embodiments of the present disclosure and are not intended to limit the present disclosure. Although the present disclosure is described in detail with reference to the foregoing embodiments, a person skilled in the art can still make modifications to the technical solutions described in the foregoing embodiments, or make equivalent replacement of some technical features therein. Any modifications, equivalent substitutions, improvements, and the like made within the spirit and principle of the present disclosure should be included within the protection scope of the present disclosure.

What is claimed is:

1. A physics-based and data-driven integrated method for rock burst hazard assessment, comprising the following steps:

establishing a three-dimensional model of an assessment region as mining district at one or more processors;

determining an initial stress concentration coefficient by conducting grid discretization on the three-dimensional model of the assessment region according to a certain spacing, and assigning a value to each of grid nodes using a Weibull distribution function, wherein the grid nodes are in a completely homogeneous state by default (m=0), with the value of 1;

assessing a geological structure, layout of a roadway, and advancing of a working face for the assessment region, selecting, based on the assessing, physics-based models for the grid nodes to calculate stress concentration factor values of each grid node for selected physics-based models, and conducting superposition calculation on the stress concentration factor values of each grid node for the selected physics-based models to obtain a stress concentration coefficient of each grid node under the physics-based models;

preliminarily correcting, based on seismic wave CT detection data, the stress concentration coefficient of each grid node by using a seismic wave CT detection and its derived characterization stress model;

further correcting, based on microseismic data, the stress concentration coefficient preliminarily corrected of each grid node by using a microseismic damage reconstruction stress model, and finally assessing a degree of rock burst hazard according to a size of the stress concentration coefficient value further corrected; and receiving, at the one or more processor, seismic wave CT detection data and microseismic data detected in real time regarding the assessment region for the preliminarily correcting and the further correcting, outputting corresponding size of stress concentration coefficient value further corrected and corresponding degree of rock burst hazard in real time, and transmitting a warning signal to a monitoring and early warning cloud platform for early warning in responding to the corresponding size of stress concentration coefficient value exceeding a predetermined threshold.

2. The physics-based and data-driven integrated method for rock burst hazard assessment according to claim 1, wherein the physics-based models comprise a discrete point stress concentration model, a discrete point stress damage model, a regional stress concentration model, a regional stress damage model, a linear stress concentration model and a linear stress damage model, wherein model parameters of the physics-based models are @n, m, F, d, and S, @n denotes an identifier of a calculation model, and covers @0, @1, @2, @3, @4 and @5 which respectively correspond to the discrete point stress concentration model, the discrete point stress damage model, the regional stress concentration model, the regional stress damage model, the linear stress concentration model and the linear stress damage model, m and F denote heterogeneity parameters and shape parameters of the Weibull distribution function, d denotes influence distance and range of factor disturbance, and S denotes a spacing of discrete points.

3. The physics-based and data-driven integrated method for rock burst hazard assessment according to claim 2, wherein the discrete point stress concentration model, the regional stress concentration model and the linear stress concentration model conduct calculation by adopting a probability density attenuation model, and the discrete point stress damage model, the regional stress damage model and the linear stress damage model conduct calculation through comprehensive use of a probability density attenuation model and a damage mechanics model.

4. The physics-based and data-driven integrated method for rock burst hazard assessment according to claim 3, wherein the probability density attenuation model adopts a normal probability distribution function:

$$S_g(i) = \frac{1}{T} \Sigma g_j \frac{1}{2\pi s^2} \exp\left(\frac{-d_j^2}{2s^2}\right),$$

wherein $S_g(i)$ denotes a probability density value of a grid node i; s denotes an influence range; $d_j$ denotes a distance from a jth microseismic event or jth discrete point to an ith grid node; $g_j$ denotes an assigned parameter, and when calculation is conducted using a microseismic damage mining-induced stress model, $g_j=\sqrt{E_j}$, wherein $E_j$ denotes energy of a jth microseismic event; when calculation is conducted using the seismic wave CT detection and its derived characterization stress model, $g_j=F_j$, wherein $F_j$ denotes a value of a seismic wave CT detection result corresponding to a position of a jth discrete point; and when calculation is conducted using the physics-based models, $g_j=H_j$, wherein $H_j$ denotes a theoretical assigned value at a position of a jth discrete point.

5. The physics-based and data-driven integrated method for rock burst hazard assessment according to claim 4, wherein for theoretical value assignment at a discrete point $H_j$ in the physics-based models, a value is randomly assigned to each of the discrete points using the Weibull distribution function; wherein for the discrete point models comprising the discrete point stress damage model and the discrete point stress concentration model, a manner of direct value assignment is adopted; for the linear models comprising the linear stress damage model and the linear stress concentration model, a specified line segment first needs to be divided into equidistant discrete points by a certain spacing prior to value assignment in accordance with the discrete point models; and for the regional models comprising the regional stress damage model and the regional stress concentration model, a specified polygonal area is subject to equidistant gridding by a certain spacing prior to value assignment on each of the grid nodes in accordance with the discrete point models.

6. The physics-based and data-driven integrated method for rock burst hazard assessment according to claim 3, wherein calculation formulas of the damage mechanics model are as follows:

$$\sigma_i = S_g(i) \cdot (1 - D_i),$$

$$D_i = 1 - \exp\left\{-\frac{S_g(i)}{S_g}\right\}, \text{ and}$$

$$S_g = -\frac{\max\{S_g(i)\}}{\ln(1 - D_c)},$$

wherein $\sigma_i$ denotes an equivalent stress value corresponding to an ith grid node; $D_i$ denotes a damage parameter value of an ith grid node; $S_g$ denotes an average probability density value of an assessment region; max $\{S_g(i)\}$ denotes a maximum value of $S_g(i)$; and $D_c$ denotes a damage parameter value corresponding to a complete damage state.

7. The physics-based and data-driven integrated method for rock burst hazard assessment according to claim 1, wherein the microseismic damage reconstruction stress model and the seismic wave CT detection and its derived characterization stress model are data-driven models, the microseismic damage reconstruction stress model conducts calculation by introducing microseismic monitoring data and selecting the discrete point stress damage model in the physics-based models, and the seismic wave CT detection and its derived characterization stress model conducts calculation by introducing seismic CT inversion data and selecting the discrete point stress concentration model in the physics-based models.

8. The physics-based and data-driven integrated method for rock burst hazard assessment according to claim 1, wherein a final stress concentration coefficient of each model is calculated by adopting a following calculation formula:

when calculation is conducted using the stress damage models which comprise the discrete point stress damage model, the regional stress damage model and the linear stress damage model:

$$F_i = \frac{\sigma_i}{\sigma_{max}} \times F,$$

wherein $\sigma_i$ denotes a stress value corresponding to an ith grid node; $\sigma_{max}$ denotes a maximum stress value corresponding to the grid node; F denotes a mining-induced stress coefficient parameter value in a selected model; $F_i$ denotes a stress concentration coefficient value corresponding to the ith grid node; wherein when $F_i < 1$ and $$D_i < \frac{1}{3}D_c,$$

1 is assigned to $F_i$, and when calculation is conducted using the stress concentration models comprising the discrete point stress concentration model, the regional stress concentration model and the linear stress concentration model:

$$F_i = \frac{\sigma_i}{\sigma_{max}} \times (F - 1) + 1,$$

wherein $\sigma_i$ denotes a stress value corresponding to an ith grid node; $\sigma_{max}$ denotes the maximum stress value corresponding to the grid node; F denotes a mining-induced stress coefficient parameter value in a selected model; and $F_i$ denotes a stress concentration coefficient value corresponding to the ith grid node.

9. The physics-based and data-driven integrated method for rock burst hazard assessment according to claim 1, wherein in the case of combining the physics-based models, calculation is conducted using a superposition mode, and a calculation formula is as follows:

$$F_{i+} = F_{iq} \times F_{i-}, \text{ and}$$

in the case of combining the data-driven models, calculation is conducted using a correction mode, and a calculation formula is as follows:

$$F_{i+} = F_{iq} \times F_{i-},$$

wherein $F_{i+}$ denotes a stress concentration factor value corresponding an ith grid node after fusion update; $F_{iq}$ denotes a stress concentration coefficient value corresponding to the ith grid node under a result calculated by the model at the current step; and $F_{i-}$ denotes a stress concentration coefficient value corresponding to the ith grid node calculated by the model at the previous step.

10. The physics-based and data-driven integrated method for rock burst hazard assessment according to claim 1, wherein grid discretization is conducted by using S as a grid spacing.

* * * * *